(12) United States Patent
Kang

(10) Patent No.: US 7,352,617 B2
(45) Date of Patent: *Apr. 1, 2008

(54) NANO TUBE CELL AND MEMORY DEVICE USING THE SAME

(75) Inventor: Hee Bok Kang, Daejeongwangyeok-si (KR)

(73) Assignee: Hynix Semiconductor Inc. (KR)

( * ) Notice: Subject to any disclaimer, the term of this patent is extended or adjusted under 35 U.S.C. 154(b) by 72 days.

This patent is subject to a terminal disclaimer.

(21) Appl. No.: 11/058,218

(22) Filed: Feb. 16, 2005

(65) Prior Publication Data

US 2005/0180194 A1 Aug. 18, 2005

(30) Foreign Application Priority Data

Feb. 16, 2004 (KR) ............... 10-2004-0010040

(51) Int. Cl.
*G11C 11/36* (2006.01)

(52) U.S. Cl. ............ 365/175; 365/149; 365/151; 257/46

(58) Field of Classification Search ........ 365/175, 365/149, 151; 257/46, 107, 295, E51.04
See application file for complete search history.

(56) References Cited

U.S. PATENT DOCUMENTS

| 4,066,915 A | 1/1978 | Ohhinata |
| 4,677,455 A | 6/1987 | Okajima |
| 4,882,706 A | 11/1989 | Sinclair |
| 5,930,162 A * | 7/1999 | Peterson ............. 365/151 |
| 6,229,161 B1 | 5/2001 | Nemati et al. |
| 6,824,908 B2 | 11/2004 | Yamaura et al. |
| 7,173,843 B2 * | 2/2007 | Kang ................ 365/145 |
| 2002/0006539 A1 | 1/2002 | Kubota et al. |
| 2004/0234841 A1 | 11/2004 | Yoshitake et al. |
| 2005/0040048 A1 | 2/2005 | Kim et al. |
| 2005/0135140 A1 * | 6/2005 | Kang ................ 365/145 |
| 2005/0152174 A1 * | 7/2005 | Kang ................ 365/145 |
| 2005/0254284 A1 * | 11/2005 | Kang ................ 365/151 |

FOREIGN PATENT DOCUMENTS

KR 1020050079368 A 10/2005

* cited by examiner

*Primary Examiner*—Huan Hoang
(74) *Attorney, Agent, or Firm*—Townsend and Townsend and Crew, LLP

(57) ABSTRACT

A nano tube cell and a memory device using the same features a cross point cell using a capacitor and a PNPN nano tube switch to reduce the whole memory size. In the memory device, the unit nano tube cell comprising a capacitor and a PNPN nano tube switch which does not an additional gate control signal is located where a word line and a bit line are crossed, so that a cross point cell array is embodied. As a result, the whole chip size is reduced, and read and write operations are effectively improved.

18 Claims, 18 Drawing Sheets

NANO TUBE CELL AND MEMORY DEVICE USING THE SAME

BACKGROUND OF THE INVENTION

1. Field of the Invention

The present invention generally relates to a nano tube cell and a memory device using the same, and more specifically, to a technology of reducing the whole memory size by embodying a cross point cell using a capacitor and a PNPN nano tube switch which does not require an additional gate control signal.

2. Description of the Prior Art

FIG. 1 is a diagram illustrating a conventional DRAM cell.

A conventional DRAM cell comprises a transistor TR and a capacitor CAP which is connected between a plate line PL and one terminal of the transistor TR. The transistor TR performs a switching operation depending on a state of a word line WL to connect the capacitor CAP to a bit line BL.

Here, a switching device of the conventional DRAM cell is a NMOS transistor whose switching operation is controlled by a gate control signal. However, when a cell array is embodied by using the above-described NMOS transistor as a switching device, the whole chip size is increased.

Meanwhile, a refresh characteristic of the DRAM cell is determined by the leakage current characteristic of the NMOS transistor. When the channel length of the NMOS transistor is decreased to a nano meter (1/one billion) scale, short channel leakage current increases more by the current characteristic of a sub threshold voltage Sub Vt of the NMOS transistor. As a result, it is difficult to satisfy the refresh characteristic of the DRAM cell. Also, junction leakage current is generated in a storage node terminal which occupies a relatively large area in the DRAM cell.

Therefore, it is necessary to reduce the whole memory size by embodying a cross point cell using a capacitor and a PNPN nano tube switch which does not require an additional gate control signal.

SUMMARY OF THE INVENTION

It is an object of the present invention to provide a PNPN nano tube switch through a simple process using a Silicon On Insulator (hereinafter, referred to as "SOI") wafer in a DRAM.

It is another object of the present invention to provide a cross point cell using a capacitor and a PNPN nano tube switch which does not require an additional gate control signal, thereby reducing the whole size of the memory.

It is still another object of the present invention to effectively drive read/write operations in the above-described cell array using the capacitor and a PNPN nano tube switch, thereby improving operation characteristics of memory cells.

In an embodiment, a nano tube cell comprises a capacitor and a PNPN nano tube switch. One terminal of the capacitor is connected to a word line. The PNPN nano tube switch, which includes at least two or more PNPN diode devices successively connected in series and divided into two groups each connected in parallel between a bit line and the other terminal of the capacitor, is selectively switched depending on a voltage applied to the word line and the bit line. Here, the PNPN nano tube switch is switched to read data stored in the capacitor when a first voltage is applied to the word line, and to write data in the capacitor when a second voltage larger than the first voltage is applied to the bit line.

In another embodiment, a nano tube cell comprises a PNPN nano tube switch, a capacitor, a bit line, a contact node and a word line. The PNPN nano tube switch includes an insulating layer formed on a substrate and at least two or more PNPN diode switches which are made of silicon layers on the insulating layer and successively connected in series. The capacitor, which comprises a top electrode, an insulating film and a bottom electrode, reads and writes data depending on the amount of current applied from a word line or a bit line. The bit line is connected to both nodes of the PNPN nano tube switches through a bit line contact node. The contact node connects the bottom electrode to a common node where at least two or more PNPN diode switches are connected. The word line is formed on the top electrode.

In an embodiment, a memory device using a nano tube cell comprises a plurality of nano tube cell arrays, a plurality of word line driving units and a plurality of sense amplifiers. Each of the plurality of nano tube cell arrays includes a plurality of unit nano tube cells arranged in row and column directions. The plurality of word line driving units selectively drive word lines of the plurality of nano tube cell arrays. The plurality of sense amplifiers sense and amplify data applied from the plurality of nano tube cell arrays. Here, each of the plurality of unit nano tube cells comprises a capacitor and a PNPN nano tube switch. One terminal of the capacitor is connected to a word line. The PNPN nano tube switch, which includes at least two or more PNPN diode devices successively connected in series and divided into two groups each connected in parallel between a bit line and the other terminal of the capacitor, is selectively switched depending on a voltage applied to the word line and the bit line.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
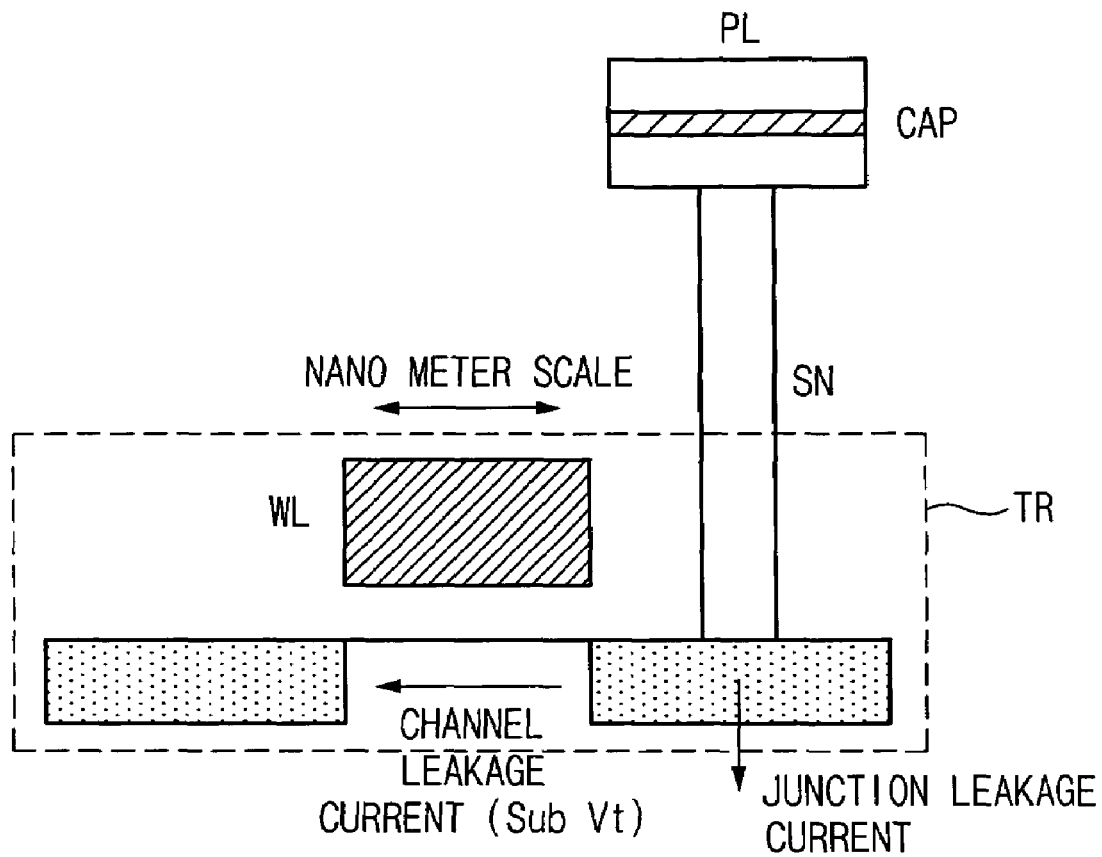
FIG. 1 is a diagram illustrating a conventional DRAM cell.
Figure 2:
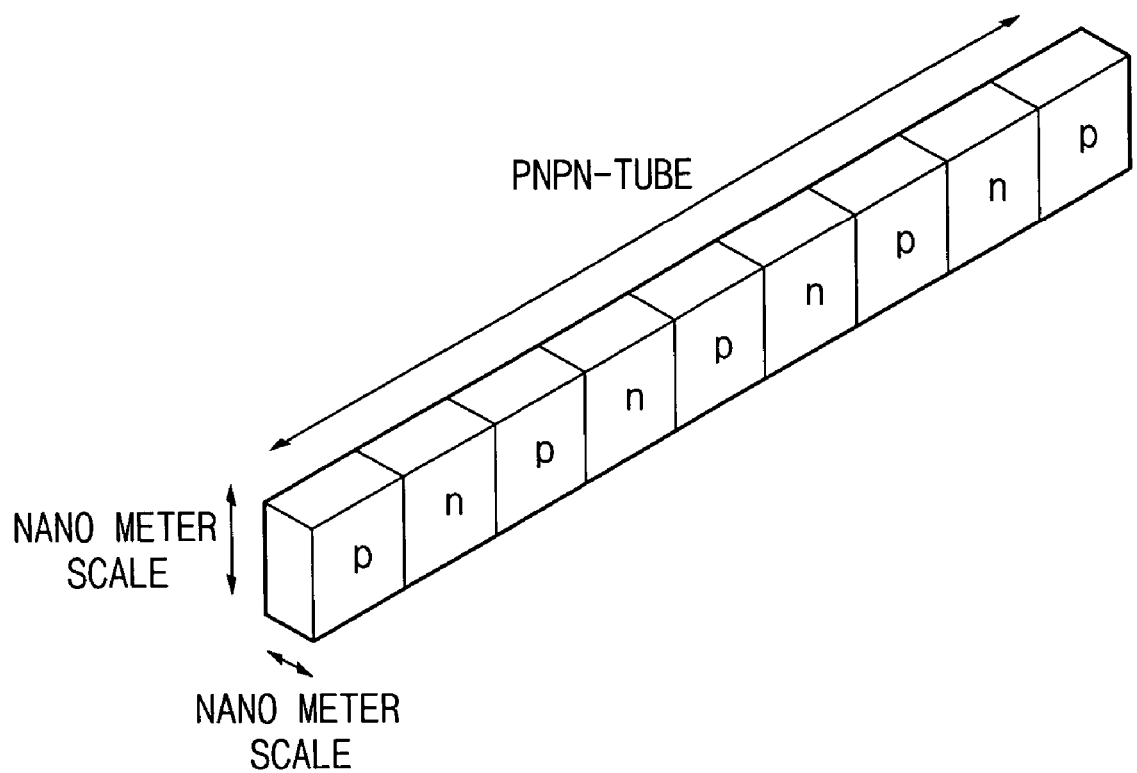
FIG. 2 is a diagram illustrating the concept of a nano tube cell according to an embodiment of the present invention.

FIG. 2 is a diagram illustrating the concept of a nano tube cell according to an embodiment of the present invention.

In an embodiment, the nano tube cell comprises at least two or more of the PNPN diode switches which are connected serially with a tube type. Each of the PNPN diode switch has a nano meter scale in width and in length. In the nano tube cell, leakage current can be reduced regardless of the size of the switch, and the size can be reduced to the atomic level on the scale.

In the size of the PNPN nano tube switch, the nano meter scale can embodied by distinguishing a P-type region and a N-type region regardless of a short channel characteristic. As a result, a special process is not required.

Specifically, the whole size of the memory can be reduced by regulating a voltage level applied to the switch device to control on/off operations without requiring an additional gate control signal. To change operation voltage characteristics of the PNPN nano tube switch, the doping concentration or area of the P-type region and the N-type region is required to be adjusted.

Figure 3:
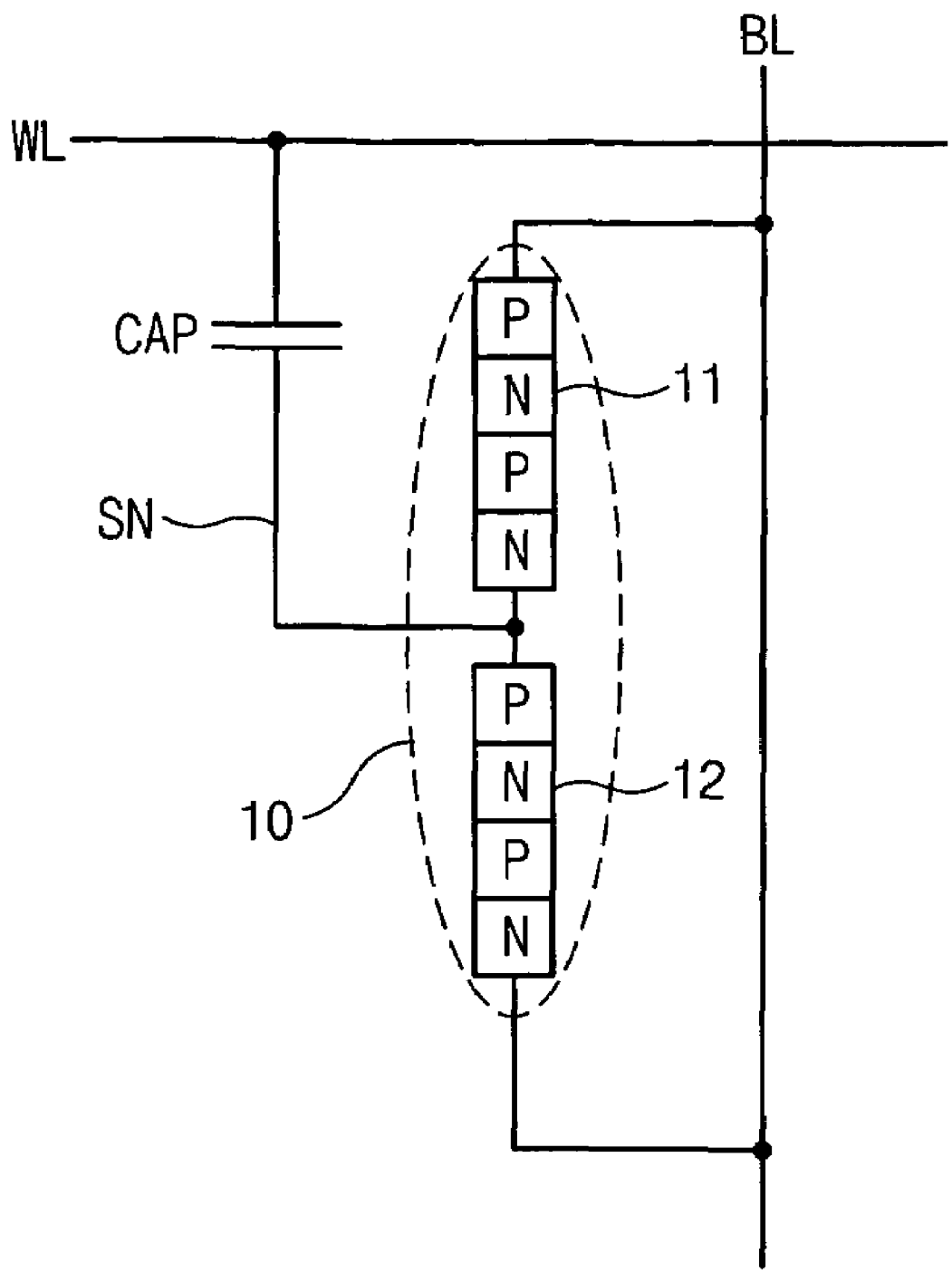
FIG. 3 is a diagram illustrating the structure of the nano tube cell according to an embodiment of the present invention.

FIG. 3 is a diagram illustrating the structure of the nano tube cell according to an embodiment of the present invention.

In an embodiment, the unit nano tube cell comprises a capacitor CAP and a PNPN nano tube switch 10. Here, the PNPN nano tube switch 10 comprises PNPN diode switches 11 and 12. The PNPN diode switches 11 and 12 are connected in parallel between a bit line BL and a bottom electrode of the capacitor CAP.

The PNPN diode switch 11 is connected backward between the bit line BL and one electrode of the capacitor CAP, and the PNPN diode switch 12 is connected forward between the bit line BL and one electrode of the capacitor CAP. The other electrode of the capacitor CAP is connected to a word line WL.

Figure 4:
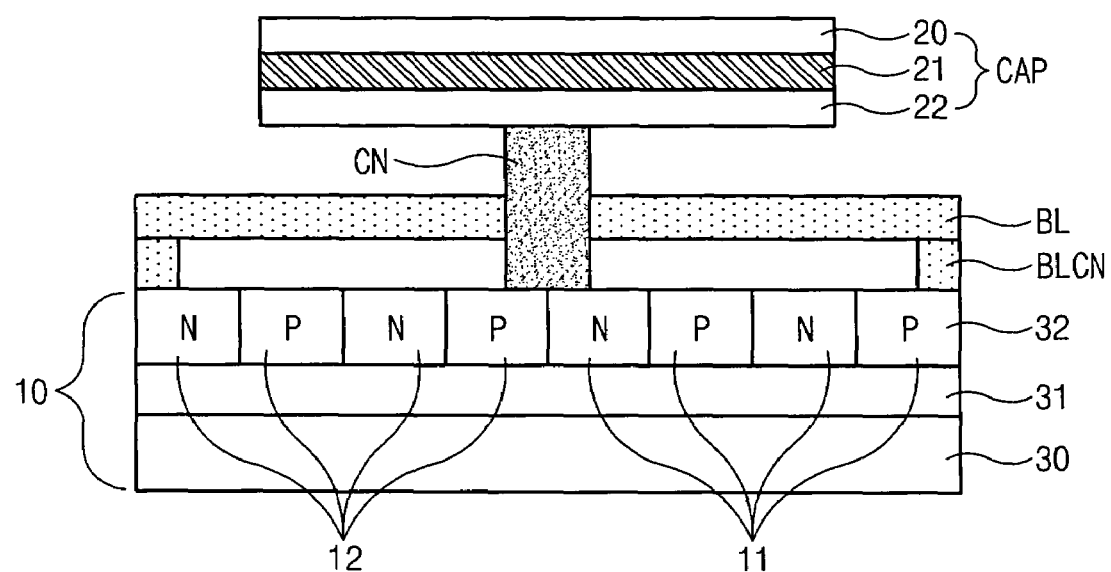
FIG. 4 is a cross-sectional diagram illustrating the nano tube cell of FIG. 3.

FIG. 4 is a cross-sectional diagram illustrating the nano tube cell of FIG. 3.

The PNPN nano tube switch 10 comprises an insulating layer 31 formed on a silicon substrate 30 and a silicon layer 32 formed on the insulating layer 31, to have a SOI structure. Here, the insulating layer 31 made of $SiO_2$ is deposited on the silicon substrate 30, and the silicon layer 32 is formed on the insulating layer 31. The silicon layer 32 forms a diode chain with a nano tube type including the PNPN diode switches 11 and 12 which are connected serially.

Each of the PNPN diode switches 11 and 12 includes a plurality of P-type regions and N-type regions which are alternately connected in series. The PN diode switch 12 includes a P-type region and a N-type region which are connected serially to the adjacent N-type region of the PNPN diode switch 11.

The bit line BL is formed through a bit line contact node BLCN on the N-type region of the PNPN diode switch 12 and the P-type region of the PNPN diode switch 11. Also, the P-type region of the PNPN diode switch 12 and the N-type region of the PNPN diode switch 11 are connected to a bottom electrode 22 of the capacitor CAP through a common contact node CN.

Here, the capacitor CAP comprises a top electrode 20, a dielectric layer 21 and a bottom electrode 22. The top electrode 20 of the capacitor CAP is connected to the word line WL.

Figure 5:
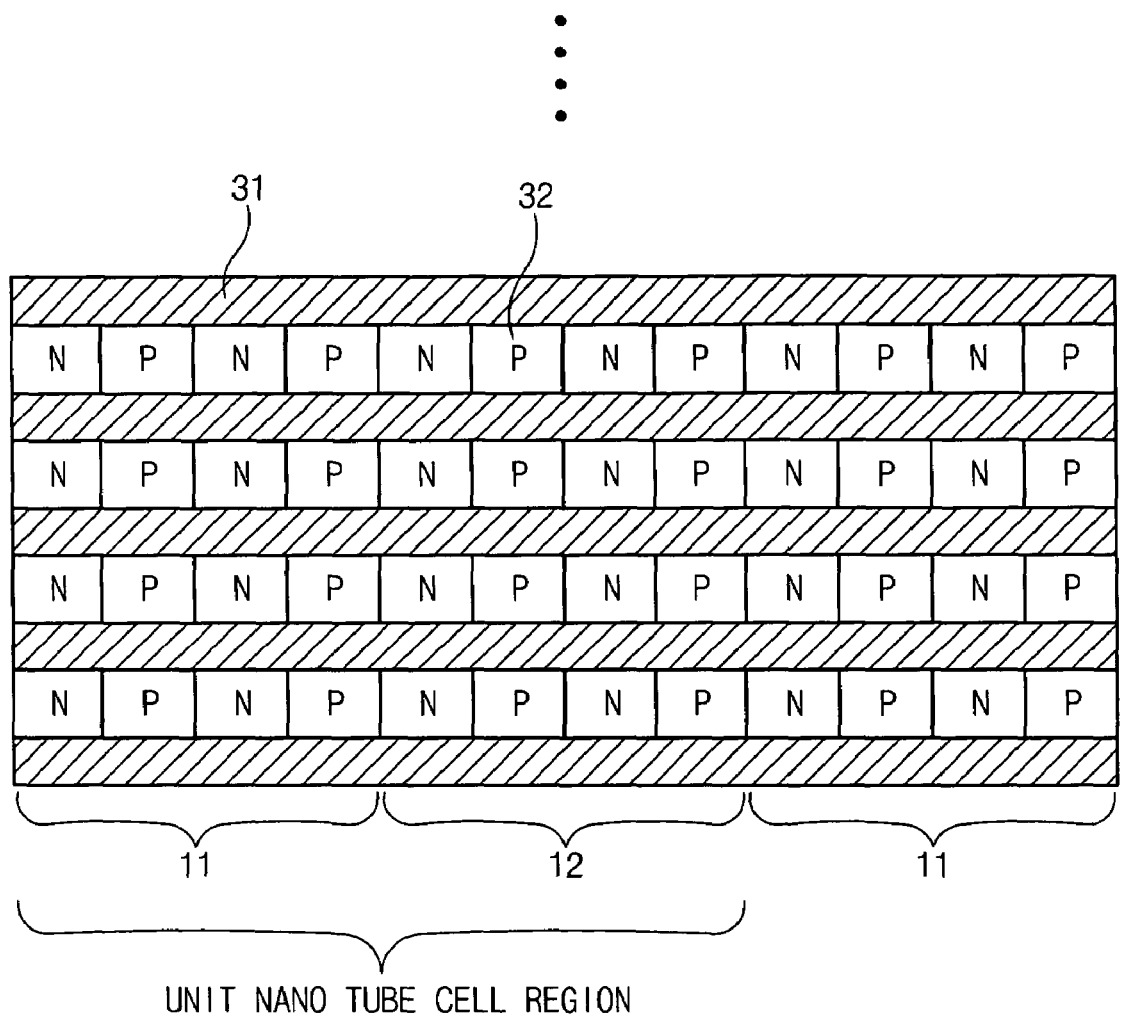
FIG. 5 is a plane diagram illustrating a PNPN nano tube switch of FIG. 3.

FIG. 5 is a plane diagram illustrating the PNPN nano tube switch 10 of FIG. 3.

The PNPN nano tube switch 10 includes the PNPN diode switches 11 and 12 which are formed of the silicon layer 32 and successively connected with a serial chain type. That is, one PNPN nano tube switch 10 comprises the PNPN diode switches 11 and 12 which are connected serially. A nano tube cell adjacent to the one nano tube cell in the same direction includes the PNPN diode switches 11 and 12 which are connected serially.

The PNPN nano tube switch 10 is arranged as a plurality of layers and the upper PNPN nano tube switch 10 and the lower PNPN nano tube switch 10 are separated by the insulating layer 31.

As a result, one nano tube cell region is configured by selecting one of the PNPN diode switches 11 and 12 successively from diode devices connected in series.

Figure 6:
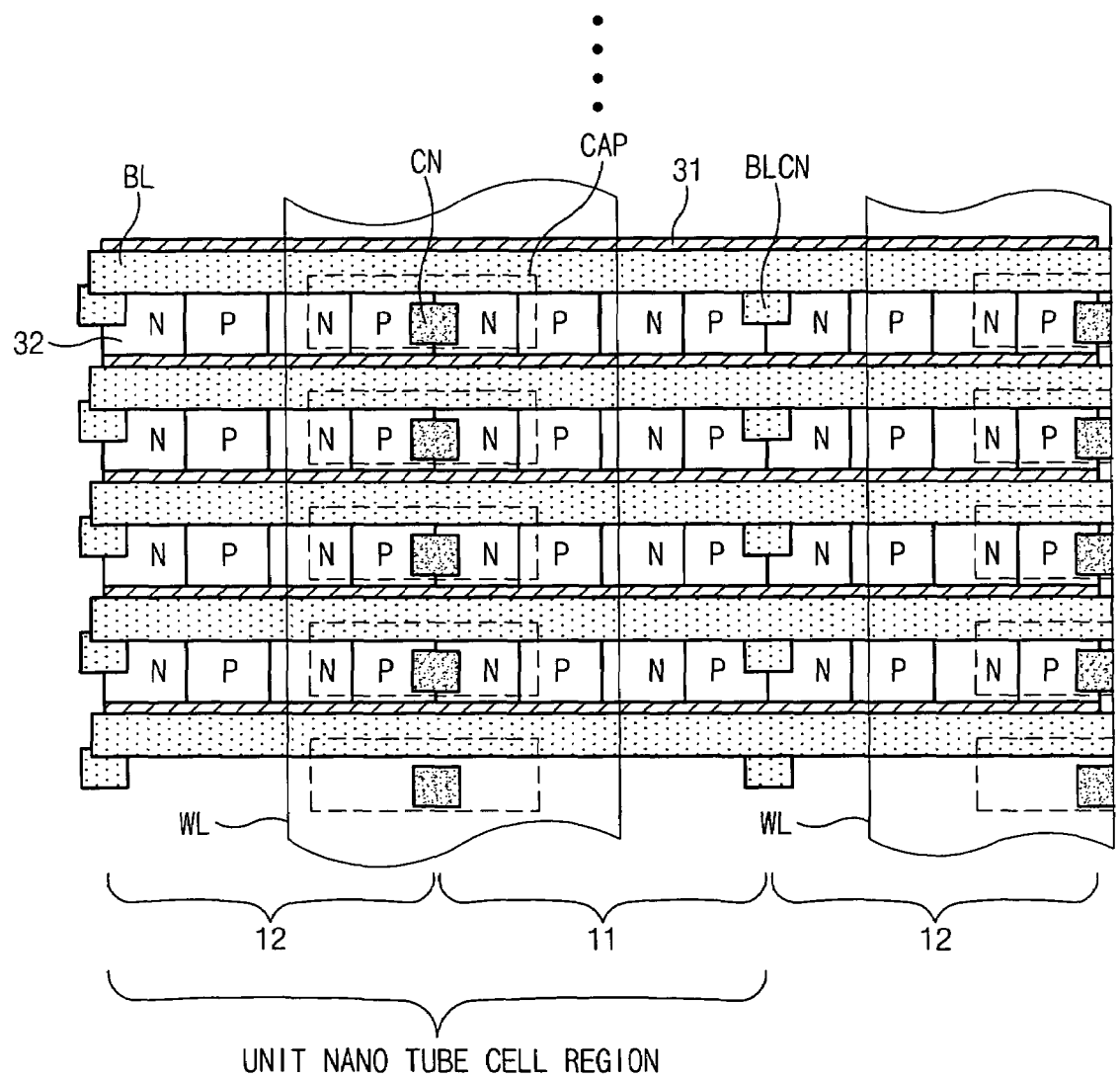
FIG. 6 is a plane diagram illustrating the nano tube cell of FIG. 3.

FIG. 6 is a plane diagram illustrating the nano tube cell of FIG. 3.

The silicon layer 32 made of deposition silicon forms the PNPN diode switches 11 and 12 which are connected serially. In each silicon layer 32, its upper and lower portions are insulated through the insulating layer 31. In the PNPN nano tube switch 10, the P-type region of the PNPN diode switch 12 is formed adjacent to the N-type region of the PNPN diode switch 11 to be connected in common to a contact node CN of the capacitor CAP.

Also, the N-type region of the PNPN diode switch 12 and the P-type region of the PNPN diode switch 11 are connected to the bit line BL through the bit line contact node BLCN. The bit line contact node BLCN is connected in common to the bit line contact node BLCN of the adjacent nano tube cell. That is, the same bit line contact node BLCN is connected in common to the P-type region of the PNPN diode switch 11 and the N-type region of the adjacent PNPN diode switch 12. A word line WL is formed on the capacitor CAP.

Figure 7:
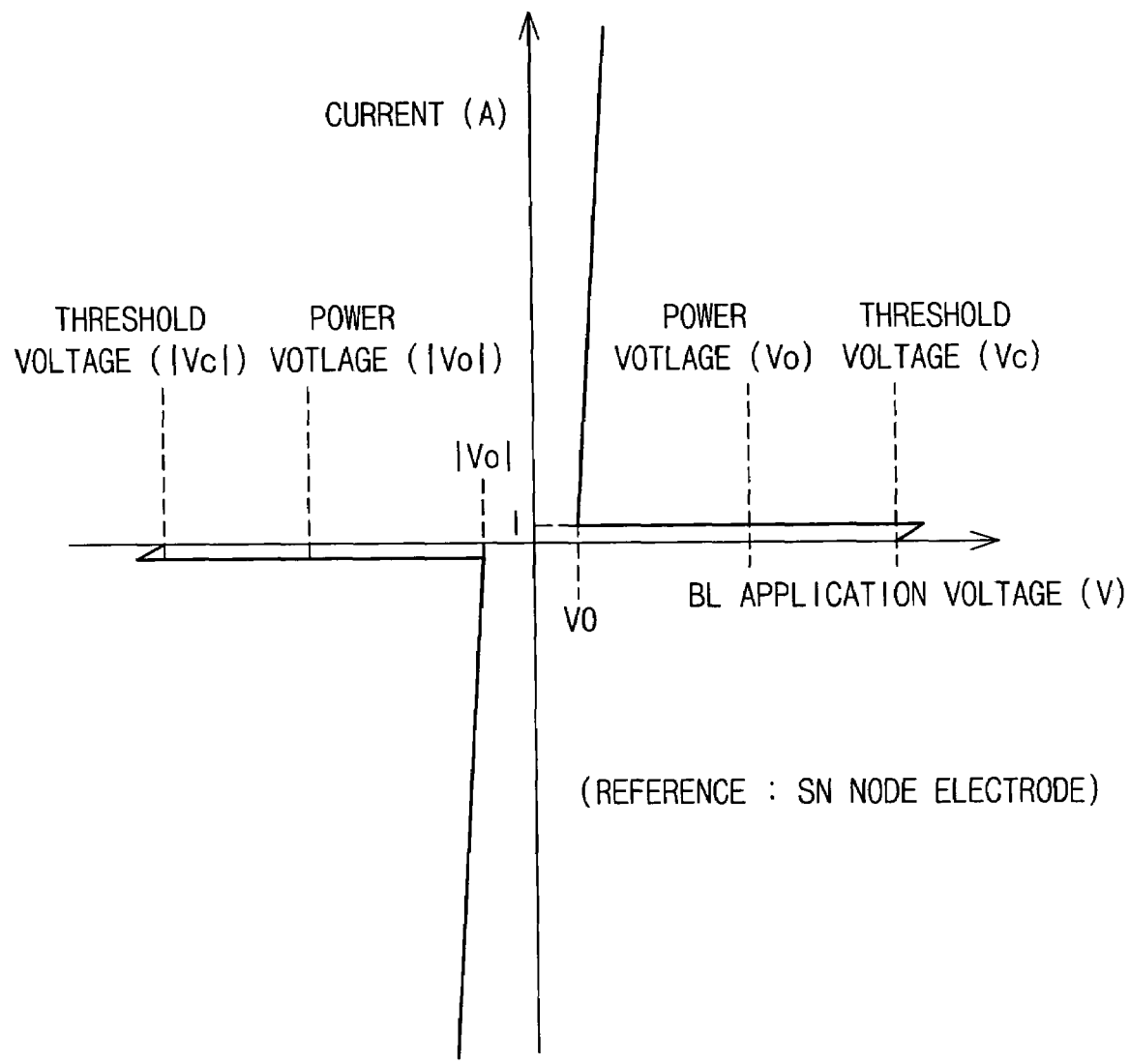
FIG. 7 is a diagram illustrating the operation of the nano tube cell of FIG. 3.

FIG. 7 is a diagram illustrating the operation of the nano tube cell 10 of FIG. 3.

When a voltage applied to the bit line BL increases in a positive direction based on a node SN, the nano tube switch 10 is kept off by the operation characteristic of the PNPN diode switch 11, so that current does not flow in an operating voltage Vo.

Thereafter, when the voltage applied to the bit line BL more increases to reach a threshold voltage Vc, the PNPN diode switch 11 is turned on by the forward operation characteristic of the diode, and the nano tube switch 10 is turned on, so that current dramatically increases. Here, when the voltage applied to the bit line BL is over the threshold voltage Vc, a value of current I depends on that of a resistor (not shown) which serves as load connected to the bit line BL.

A large amount of current can flow even when a small voltage V0 applied to the bit line BL after the PNPN diode switch 11 is turned on. Here, the PNPN diode switch 12 is kept off by the backward operation characteristic.

On the other hand, if the voltage applied to the bit line BL increases in a negative direction based on the node SN, that is, when a constant voltage is applied to the word line WL, the nano tube switch 10 is kept off by the forward operation characteristic of the PNPN diode switch 12, so that current does not flow in an operating voltage |Vo| having an absolute value.

Thereafter, when a voltage applied to the word line WL increases more to reach a threshold voltage |Vc| having an absolute value, the PNPN diode switch 12 is turned on by the forward operation characteristic of the diode to turn on the PNPN nano tube switch 10, so that current increases rapidly. Here, the PNPN diode switch 11 is kept off by the backward operation characteristic.

Figure 8A:
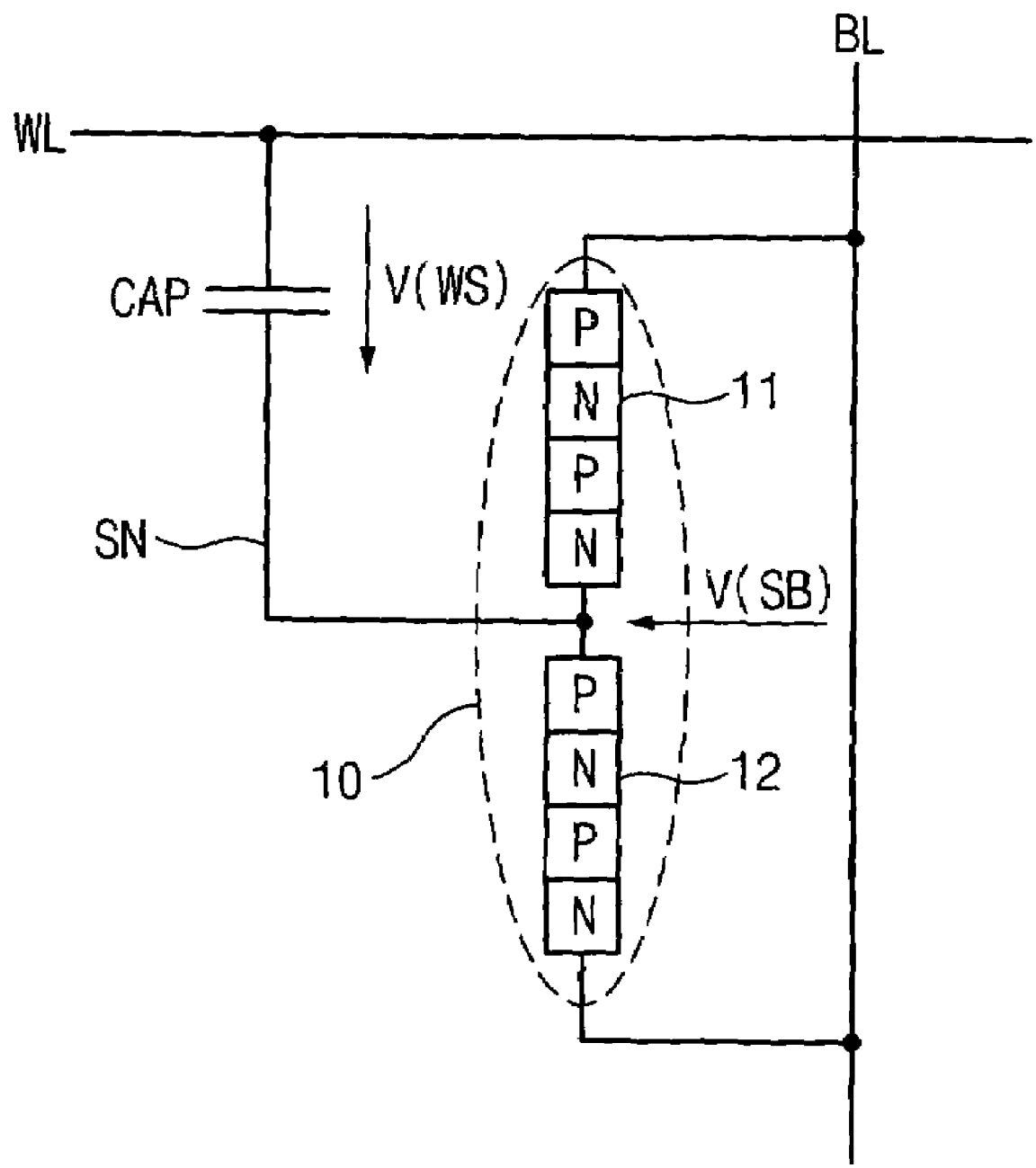
FIGS. 8a to 8c are diagrams illustrating the dependency of a word line voltage of a nano tube cell according to an embodiment of the present invention.
Figure 8B:
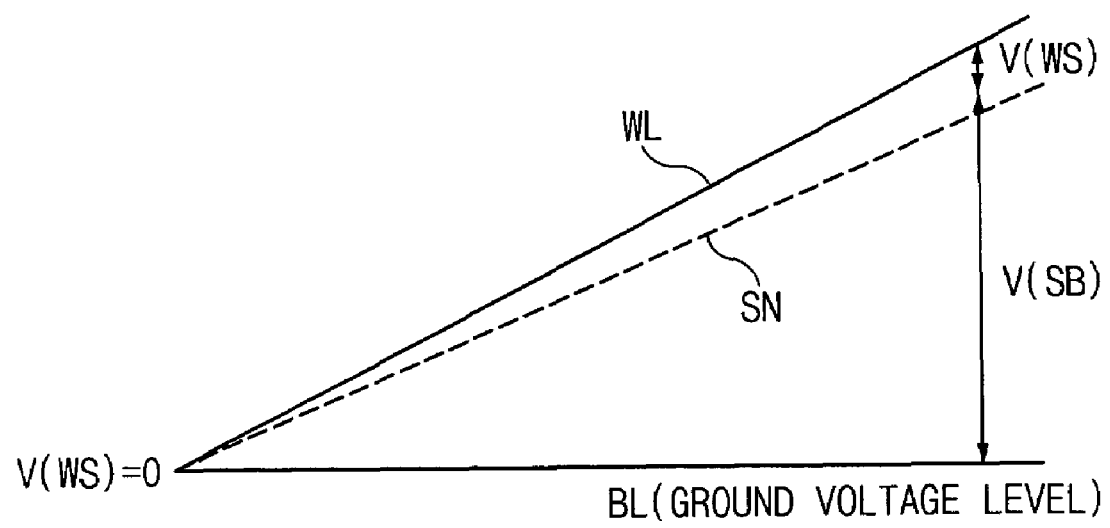
Figure 8C:
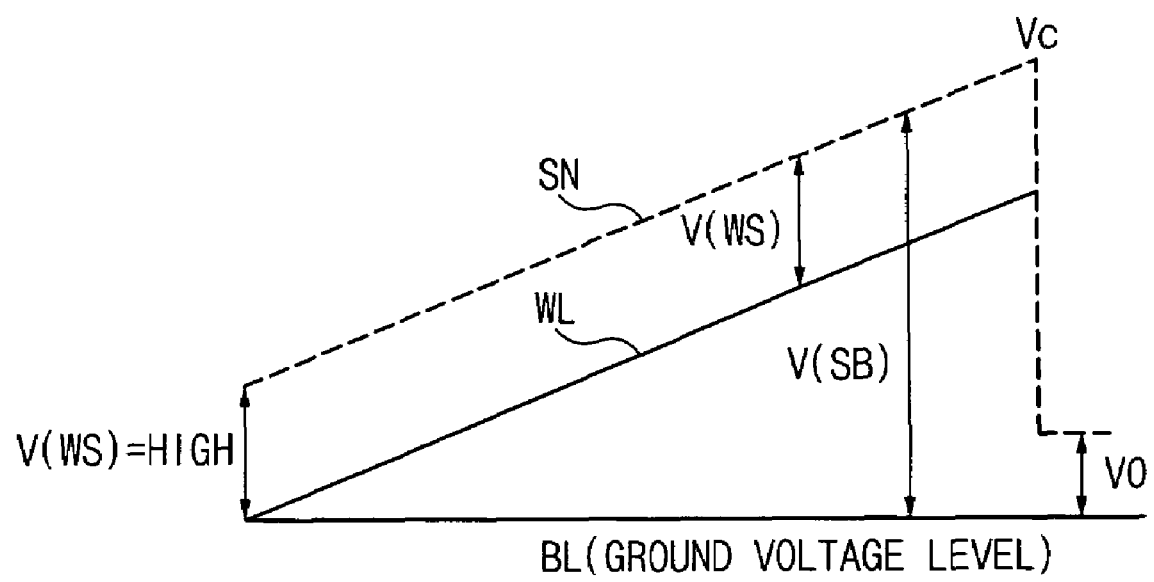

FIGS. 8a to 8c are diagrams illustrating the dependency of a word line voltage of a nano tube cell according to an embodiment of the present invention.

Referring to FIG. 8a, a voltage flowing in the capacitor CAP connected between the word line WL and a node SN refers to a voltage V(WS), and a voltage flowing in the PNPN nano tube switch 10 connected between the node SN and the bit line BL refers to a voltage V(SB).

FIG. 8b is a diagram illustrating the voltage dependency of the word line WL when data stored in the nano tube cell according to an embodiment of the present invention is 'low'.

When a voltage of the word line WL increases while a voltage of the bit line BL is fixed at a ground voltage level, the voltage of the word line WL is distributed in the capacitor CAP and the PNPN nano tube switch 10.

That is, when the data 'low' is stored in the capacitor CAP, the initial voltage V(WS) becomes 0V (low). Then, when the voltage of the word line WL increases while the voltage of the bit line BL is at the ground level, the voltage V(WS) applied to the capacitor CAP has a low voltage value by small capacitance.

On the other hand, the voltage V(SB) applied to the PNPN nano tube switch 10 has a high voltage value. Here, when the voltage applied to the word line WL does not reach a threshold voltage Vc of the PNPN diode switch 12, the PNPN diode switches 11 and 12 are continuously kept off. As a result, the low data stored in the capacitor CAP is not transmitted to the bit line BL.

FIG. 8c is a diagram illustrating the voltage dependency of the word line WL when data stored in the nano tube cell according to an embodiment of the present invention is 'high'.

When the voltage of the word line WL increases while the voltage of the bit line BL is fixed at the ground voltage level, the voltage of the word line WL is distributed in the capacitor CAP and the PNPN nano tube switch 10.

That is, when the data 'high' is stored in the capacitor CAP, the initial voltage V(WS) becomes a predetermined voltage ('high'). Then, when the voltage of the word line WL increases while the voltage of the bit line BL is at the ground level, the voltage V(SB)=the voltage V(WL) applied to the word line WL+the initial voltage V(WS) by small capacitance of the PNPN nano tube switch 10. Here, the PNPN nano tube switch 10 is kept off before the voltage of the word line WL becomes the threshold voltage Vc.

Thereafter, when the voltage V(SB) reaches the threshold voltage Vc of the PNPN diode switch 12, the PNPN diode switch 12 is turned on, so that the high data stored in the capacitor CAP is transmitted to the bit line BL. Here, charges applied to the bit line BL are a value obtained by adding charges stored in the node SN at the initial state and charges induced by the voltage of the word line WL. That is, the value in the embodiment of the present invention is defined as V0 as shown in FIG. 7. Here, the PNPN diode switch 11 is kept off by the backward operation characteristic.

Figure 9:
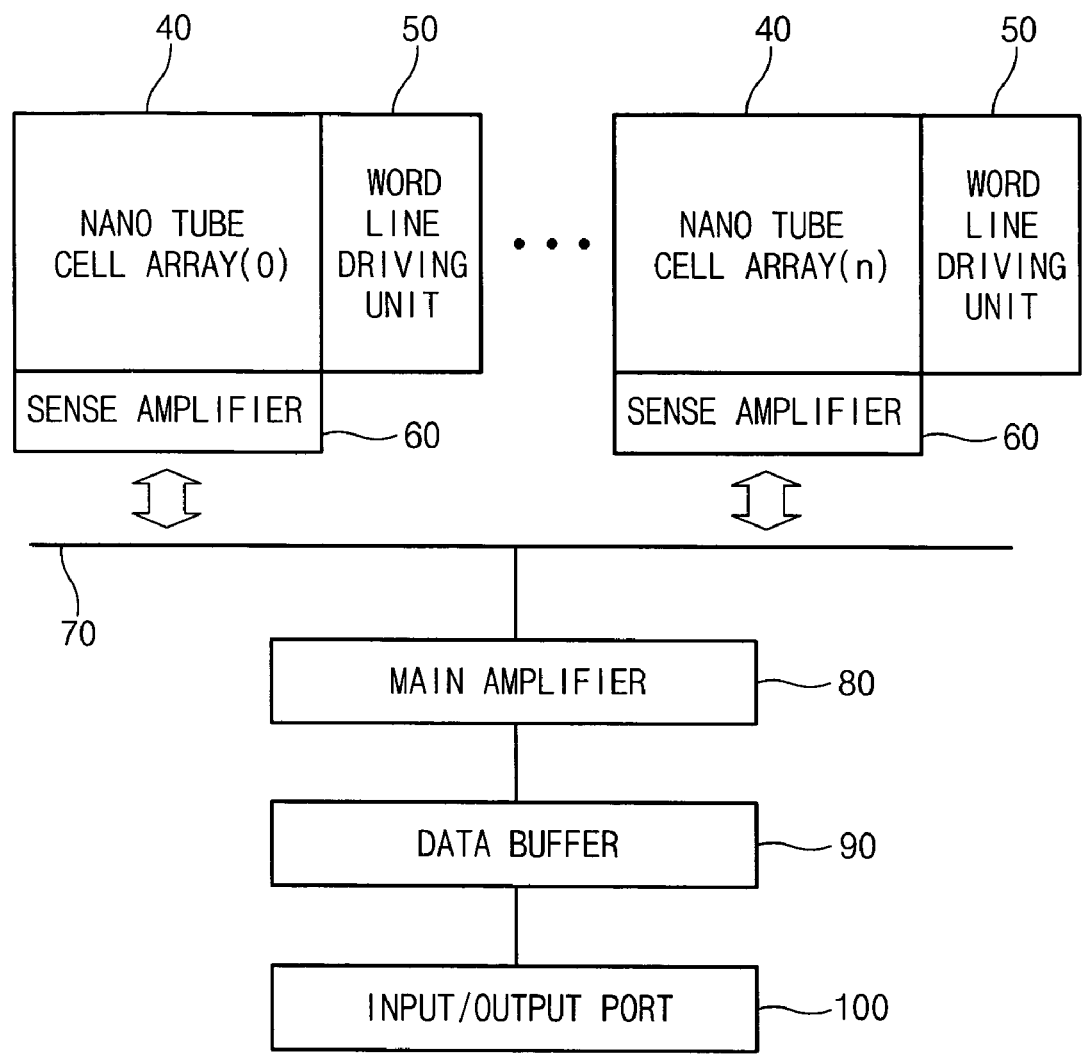
FIG. 9 is a diagram illustrating a memory device using a nano tube cell according to an embodiment of the present invention.

FIG. 9 is a diagram illustrating a memory device using a nano tube cell according to an embodiment of the present invention.

In an embodiment, the memory device comprises a plurality of nano tube cell arrays 40, a plurality of word line driving units 50, a plurality of sense amplifiers 60, a data bus 70, a main amplifier 80, a data buffer 90 and an input/output port 100.

Each nano tube cell array 40 comprises a plurality of unit nano tube cells each having the structure shown in FIG. 3 which are arranged in row and column directions. A plurality of word lines WL arranged in the row direction are connected to the word line driving unit 50. A plurality of bit lines BL arranged in the column direction are connected to the sense amplifier 60.

Here, one nano tube cell array 40 is correspondingly connected to one word line driving unit 50 and one sense amplifier 60.

A plurality of sense amplifiers 60 shares one data bus 70. The data bus 70 is connected to the main amplifier 80 which amplifies data applied from each sense amplifier 60 through the data bus 70.

The data buffer 90 buffers the amplified data applied from the main amplifier 80. The input/output port 100 externally outputs output data applied from the data buffer 90, and applies externally applied input data to the data buffer 90.

Figure 10:
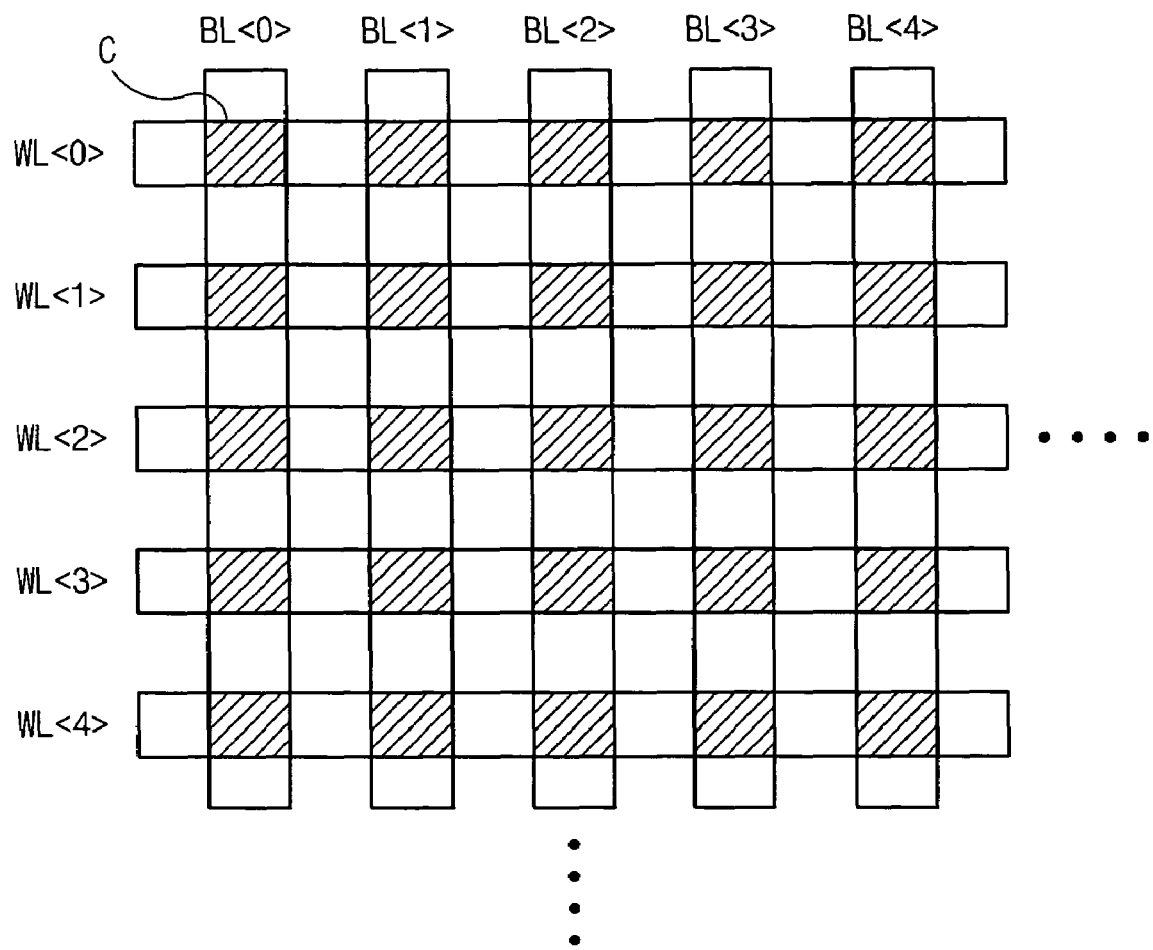
FIG. 10 is a layout diagram illustrating a nano tube cell array of FIG. 9.

FIG. 10 is a layout diagram illustrating the nano tube cell array 40 of FIG. 9.

The nano tube cell array 40 includes a plurality of word lines WL arranged in the row direction and a plurality of bit lines BL arranged in the column direction. Since a unit cell C is positioned only where the word line WL and the bit line BL are crossed, a cross point cell which does not require an additional area can be embodied.

Here, the cross point cell does not comprise a NMOS transistor which uses an additional word line WL gate control signal. The cross point cell refers to a structure where the capacitor CAP is located at a cross point of the bit line BL and the word line WL with the PNPN nano tube switch 10 comprising two electrode nodes.

Figure 11:
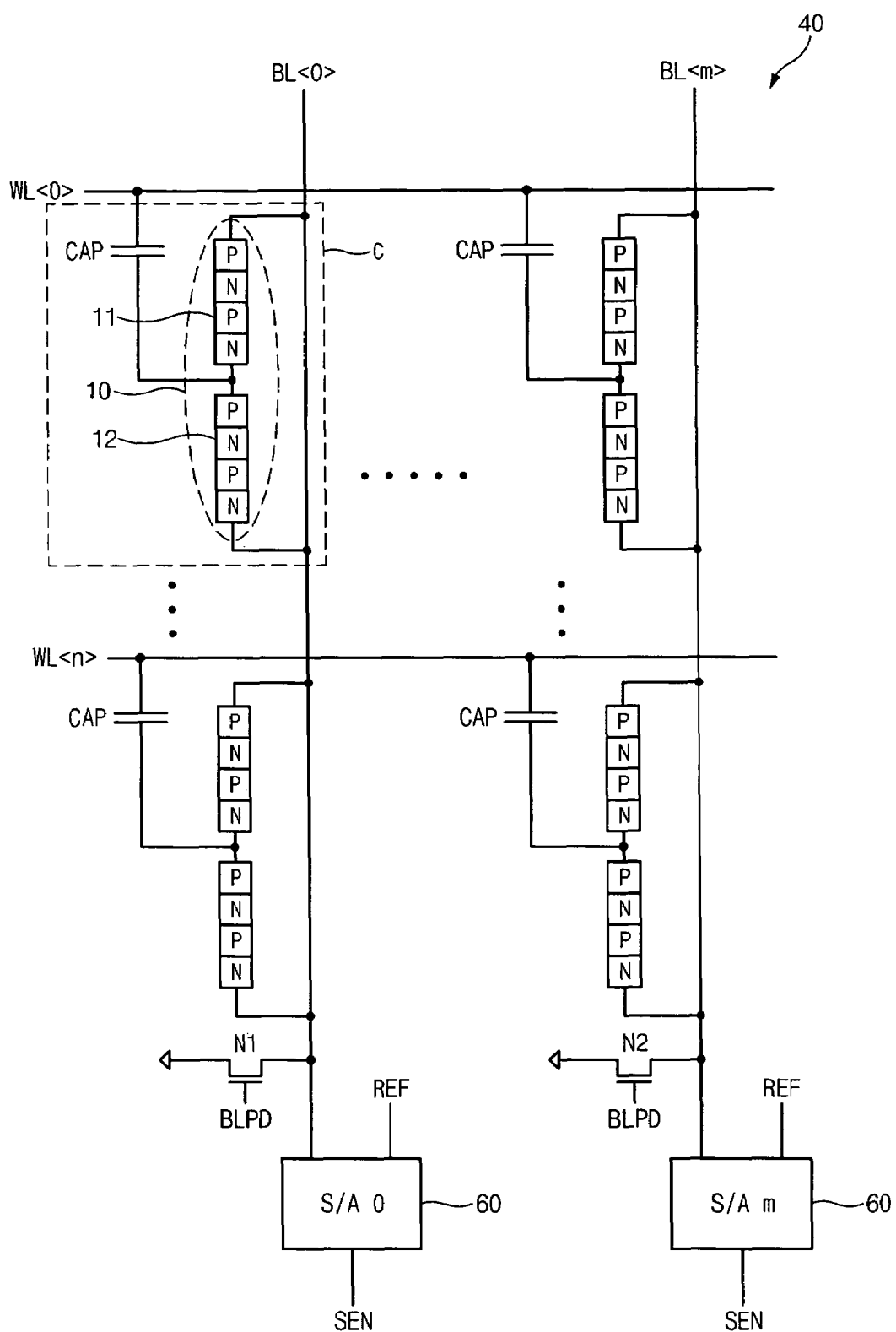
FIG. 11 is a circuit diagram illustrating the nano tube cell array of FIG. 9.

FIG. 11 is a circuit diagram illustrating the nano tube cell array 40 of FIG. 9.

The nano tube cell array 40 comprises a plurality of word lines WL<0>~WL<n> each arranged in the row direction and a plurality of bit lines BL<0>~BL<m> each arranged in the column direction. A unit cell C is located only in a region where the word line WL and the bit line BL are crossed. Here, one unit cell C comprises the capacitor CAP and the PNPN nano tube witch 10.

The plurality of sense amplifiers 60 are connected one by one to the plurality of bit lines BL<0>~BL<m>. When a sense amplifier enable signal SEN is activated, each sense amplifier 60 compares a predetermined reference voltage REF with a voltage applied from the bit line BL and amplifies the comparison result.

A bit line pull-down device N1 is connected to the bit line BL<0>, and a bit line pull-down device N2 is connected to the bit line BL<m>. As a result, when a bit line pull-down signal BLPD is activated, a ground voltage is applied to the bit line BL to be pulled down to the ground level.

The above-described nano tube cell array 40 is configured so that each of the capacitors CAP can store one data.

Figure 12:
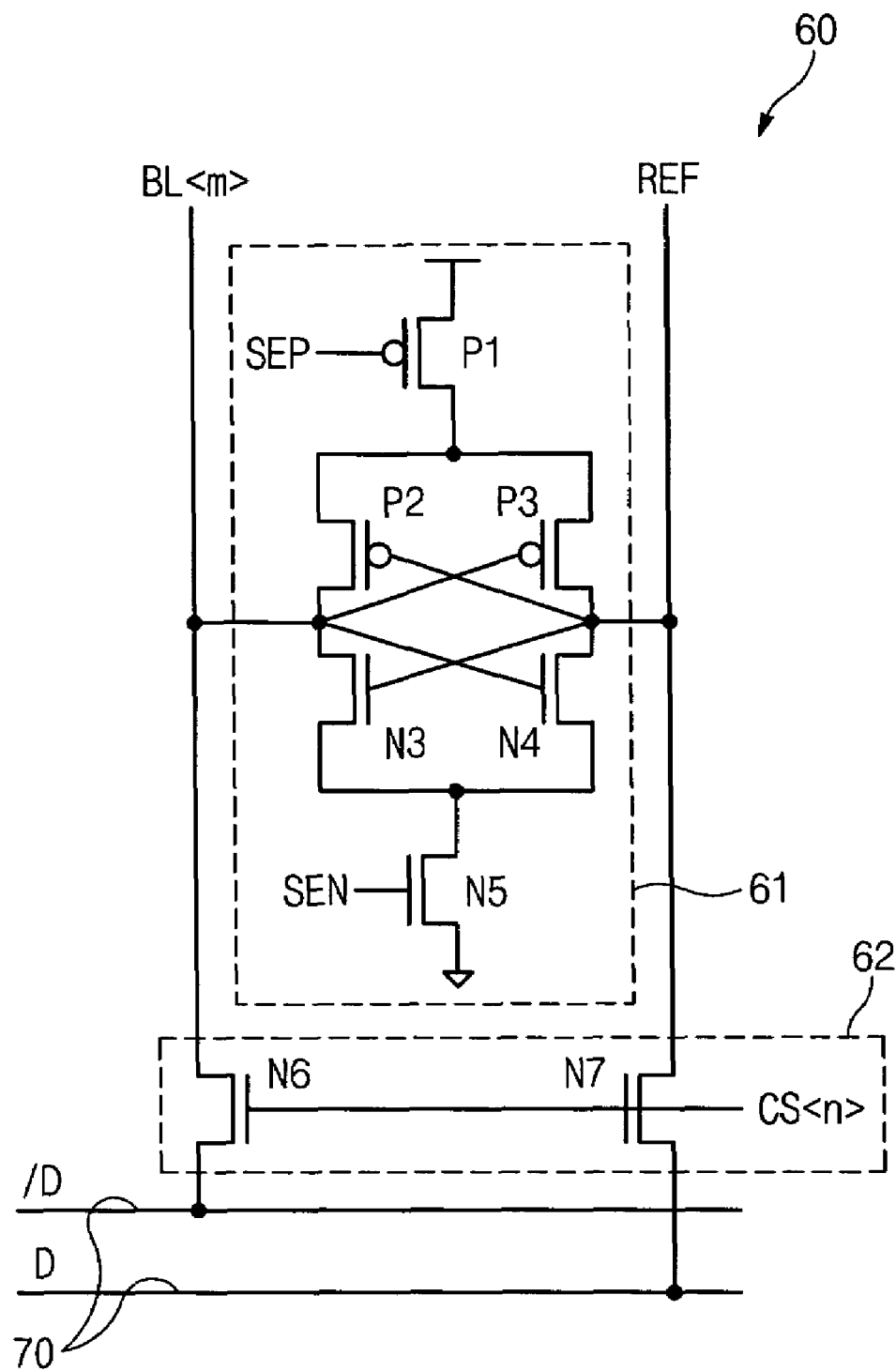
FIG. 12 is a circuit diagram illustrating a sense amplifier of FIG. 11.

FIG. 12 is a circuit diagram illustrating the sense amplifier 60 of FIG. 11.

The sense amplifier 60 comprises an amplification unit 61 and a column selection switching unit 62.

Here, the amplification unit 61 comprises PMOS transistors P1~P3 and NMOS transistors N3~N5. The PMOS transistor P1, connected between a power voltage terminal and a common source of the PMOS transistors P2 and P3, has a gate to receive a sense amplifier enable signal SEP. The cross-coupled PMOS transistors P2 and P3 latch a power voltage applied through the PMOS transistor P1.

A NMOS transistor N5, connected between a ground voltage terminal and a common source of NMOS transistors N3 and N4, has a gate to receive the sense amplifier enable signal SEN. The cross-coupled NMOS transistors N3 and N4 latch the ground voltage applied through the NMOS transistor N5.

Here, the sense amplifier enable signal SEN has an opposite phase to that of the sense amplifier enable signal SEP. When the sense amplifier enable signal SEN is activated, the amplification unit 61 is operated. One output terminal of the amplification unit 61 is connected to the bit line BL<m>, and the other output terminal of the amplification unit 61 is connected to a terminal to receive the reference voltage REF.

The column selection switching unit 62 comprises NMOS transistors N6 and N7. The NMOS transistor N6, connected between the bit line BL<m> and the data bus 70, controls input/output operations of data /D in response to a column selecting signal CS<n> applied through its gate. The NMOS transistor N7, connected between the data bus 70 and the terminal to receive the reference voltage REF, controls input/output operations of data D in response to the column selecting signal CS<n> applied through its gate.

Figure 13:
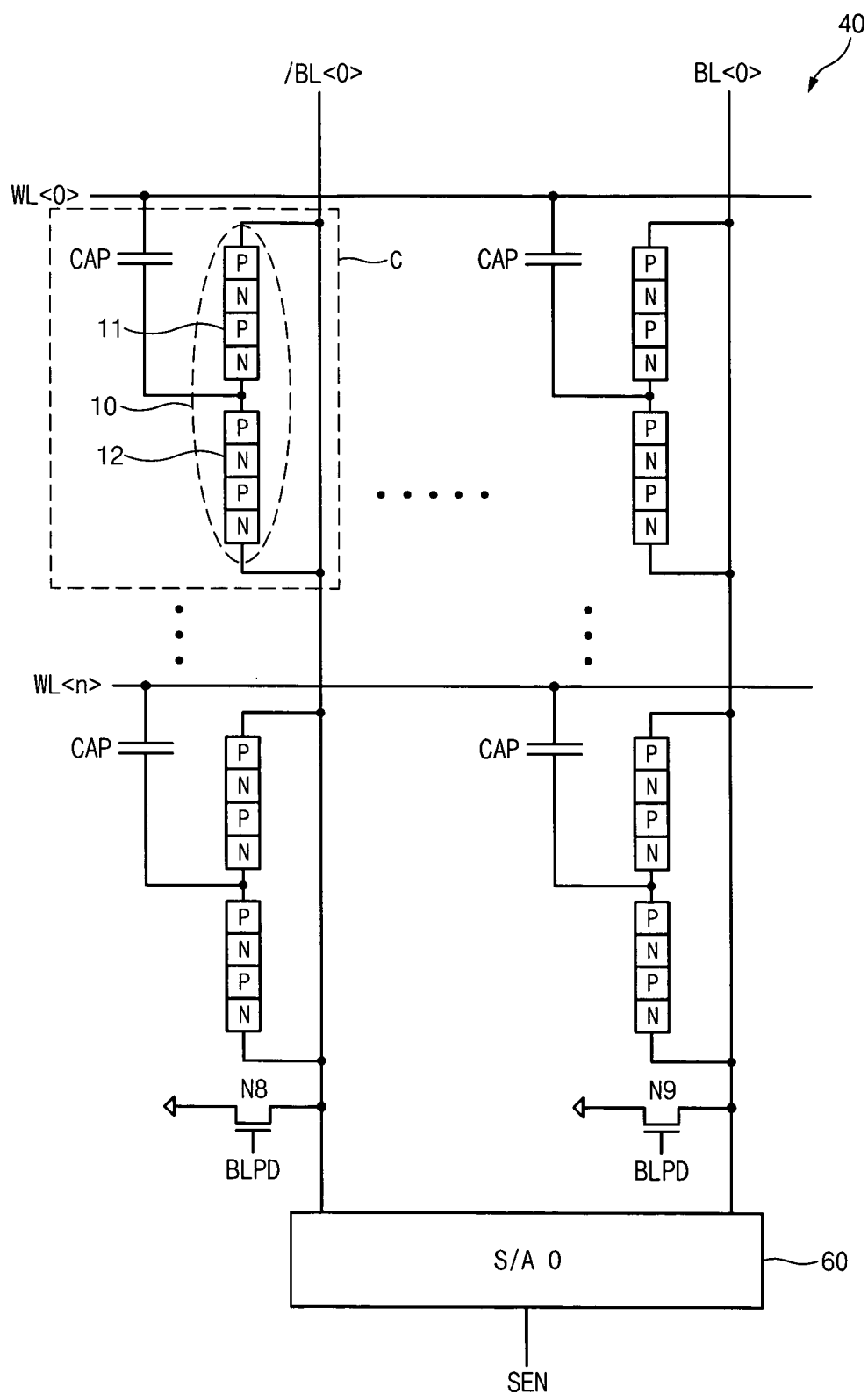
FIG. 13 is a diagram illustrating a nano tube cell array of FIG. 9 according to another embodiment of the present invention.

FIG. 13 is a diagram illustrating the nano tube cell array 40 of FIG. 9 according to another embodiment of the present invention.

The nano tube cell array 40 of FIG. 13 comprises a plurality of word lines WL<0>~WL<n> each arranged in the row direction and a plurality of paired bit lines BL and /BL each arranged in the column direction. A unit cell C is positioned only where the word line WL and the paired bit lines BL and /BL are crossed. The unit cell C comprises the capacitor CAP and the PNPN nano tube switch 10.

One sense amplifier 60 is connected to the paired bit lines BL and /BL. When the sense amplifier enable signal SEN is activated, each sense amplifier 60 amplifies data applied from the paired bit lines BL and /BL.

A bit line pull-down device N8 is connected to the bit line /BL<0>, and a bit line pull-down device N9 is connected to the bit line BL<0>. As a result, when the bit line pull-down signal BLPD is activated, the bit line pull-down devices N8 and N9 apply the ground voltage to the paired bit lines BL and /BL to be pulled down to the ground voltage level.

In the above-described nano tube cell array 40 of FIG. 13, the two capacitors CAP connected to the paired bit lines BL and /BL can store one data.

Figure 14:
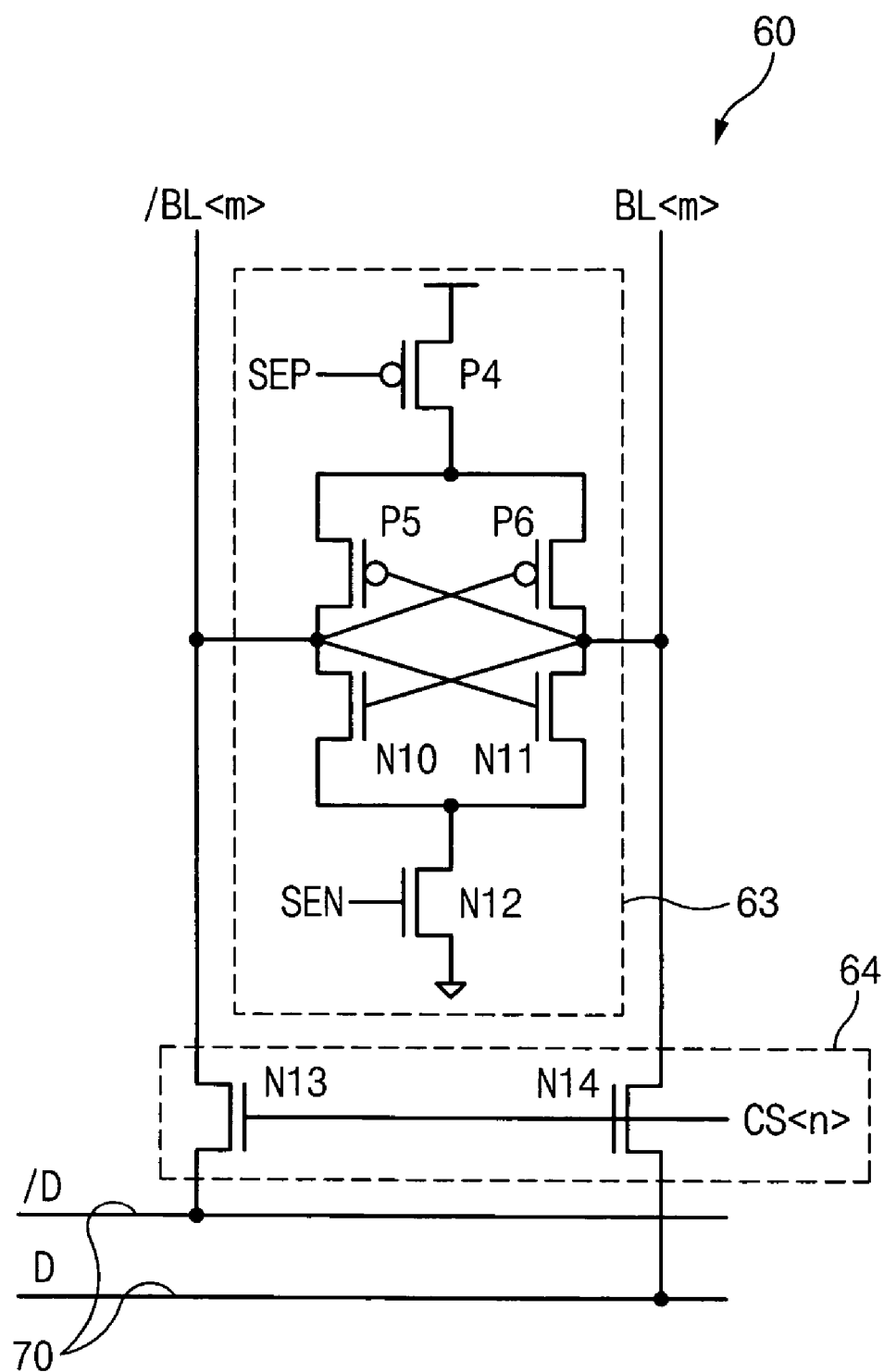
FIG. 14 is a circuit diagram illustrating a sense amplifier of FIG. 13.

FIG. 14 is a circuit diagram illustrating the sense amplifier 60 of FIG. 13.

The sense amplifier 60 of FIG. 14 comprises an amplification unit 63 and a column selection switching unit 64.

Here, the amplification unit 63 comprises PMOS transistors P4~P6 and NMOS transistors N10~N12. The PMOS transistor P4, connected between a power voltage terminal and a common source of the PMOS transistors P5 and P6, has a gate to receive a sense amplifier enable signal SEP. The cross-coupled PMOS transistors P5 and P6 latch a power voltage applied through the PMOS transistor P4.

A NMOS transistor N12, connected between a ground voltage terminal and a common source of NMOS transistors N10 and N11, has a gate to receive the sense amplifier enable signal SEN. The cross-coupled NMOS transistors N10 and N11 latch the ground voltage applied through the NMOS transistor N12.

Here, the sense amplifier enable signal SEN has an opposite phase to that of the sense amplifier enable signal SEP. When the sense amplifier enable signal SEN is activated, the amplification unit 63 is operated. One output terminal of the amplification unit 63 is connected to the bit line /BL<m>, and the other output terminal of the amplification unit 61 is connected to the bit line BL<m>.

The column selection switching unit 64 comprises NMOS transistors N13 and N14. The NMOS transistor N13, connected between the bit line /BL<m> and the data bus 70, controls input/output operations of data /D in response to a column selecting signal CS<n> applied through its gate. The NMOS transistor N14, connected between the bit line BL<m> and the data bus 70, controls input/output operations of data D in response to the column selecting signal CS<n> applied through its gate.

Figure 15:
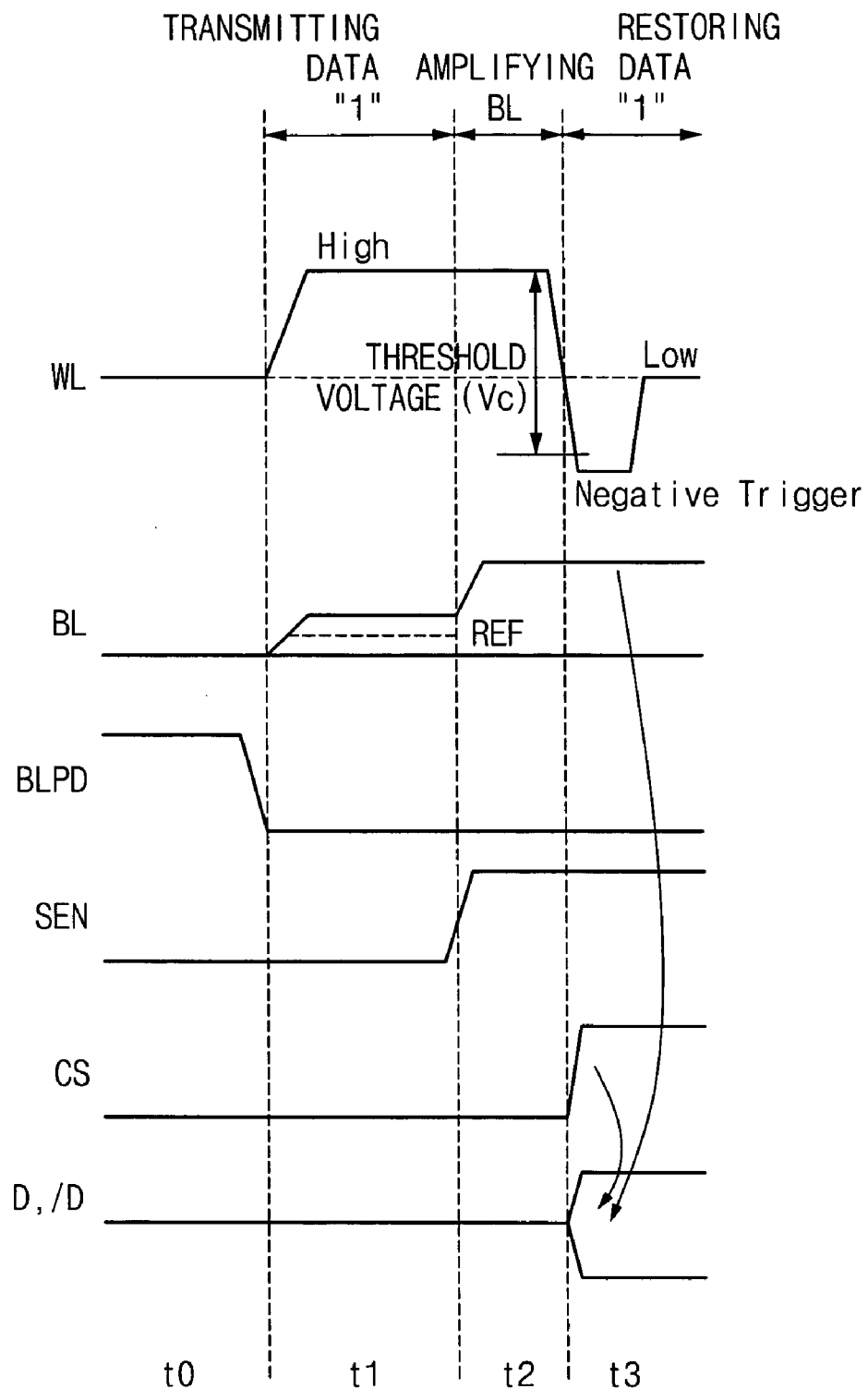
FIG. 15 is a diagram illustrating the read mode of the memory device using a nano tube cell according to an embodiment of the present invention.

FIG. 15 is a diagram illustrating the read mode of the memory device using a nano tube cell according to an embodiment of the present invention.

In a period t0, the bit line pull-down signal BLPD is activated to apply the ground voltage to the bit lines BL, so that the bit line BL is precharged to the ground level.

Thereafter, when a period t1 starts, if the word line WL transits to 'high' and a predetermined voltage is applied to the word line WL, the PNPN diode switch 12 of the PNPN nano tube switch 10 is turned on. As a result, data stored in the nano tube cell is transmitted to the bit line BL. Here, the bit line pull-down signal BLPD transits to 'low'.

Here, when the data stored in the capacitor CAP is 'low', the PNPN diode switch 12 is kept off, so that the voltage level of the bit line BL is not changed. On the other hand, the PNPN diode switch 12 is turned on only when the data stored in the capacitor CAP is 'high', so that the voltage level of the bit line BL rises to a high sensing voltage level.

In a period t2, the sense amplifier enable signal SEN is activated to amplify data in the bit line BL.

Thereafter, in a period t3, the voltage of the word line WL transits to a negative voltage which is a value below the threshold voltage Vc. That is, a difference between the low voltage level of the bit line BL and the negative voltage level of the word line WL does not reach the state of the threshold voltage Vc to turn on the PNPN diode switch 11 of the PNPN nano tube switch 10.

However, a voltage over the threshold voltage Vc to turn on the PNPN diode switch 11 is applied depending on the difference between the high amplification voltage of the bit line BL and the negative voltage of the word line WL. As a result, the PNPN diode switch 11 is turned on to restore data "1" in the nano tube cell.

After the PNPN diode switch 11 is turned on, as shown in FIG. 7, a large amount of current can flow although a small voltage V0 is applied to the bit line BL. As a result, in the period t3, although the voltage of the word line WL rises from the negative voltage to the low level, current can flow sufficiently.

In the period t3, if a column selecting signal CS transits to 'high', the NMOS transistors N6 and N7 of the column selection switching unit 62 are turned on. Then, the data D and /D in the bit line BL are outputted to the data bus 70, so that data stored in the nano tube cell C can be read.

Figure 16:
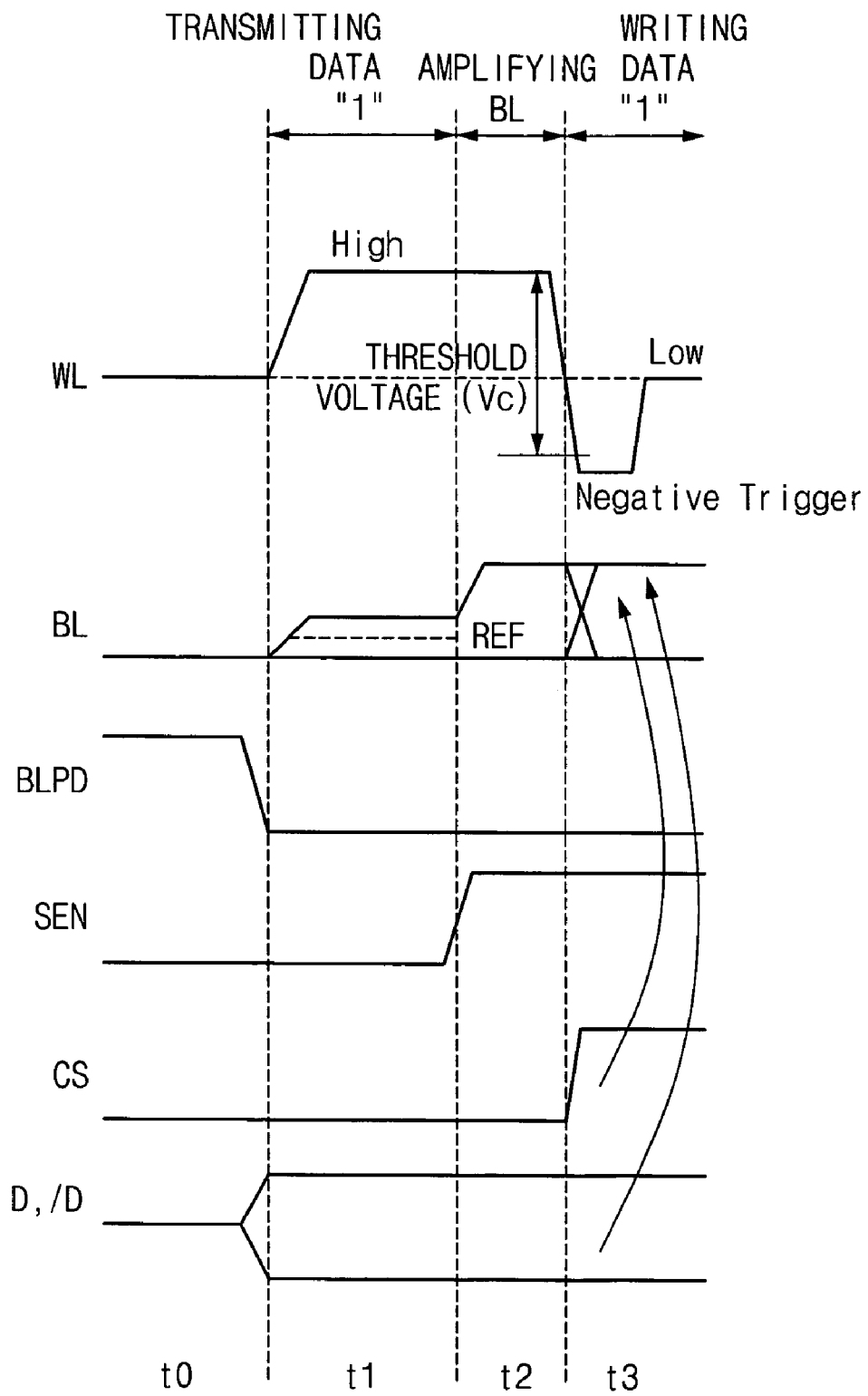
FIG. 16 is a diagram illustrating the write mode of the meory device using a nano tube cell according to an embodiment of the present invention.

FIG. 16 is a diagram illustrating the write mode of the meory device using a nano tube cell according to an embodiment of the present invention.

In a period t0, the bit line pull-down signal BLPD is activated to apply the ground voltage to the bit line BL, so that the bit line BL is precharged to the ground level.

Thereafter, when a period t1 starts, if the word line WL transits to 'high' and a predetermined voltage is applied to the word line WL, the PNPN diode switch 12 of the PNPN nano tube switch 10 is turned on. As a result, data stored in the nano tube cell are transmitted to the bit line BL. Then, the bit line pull-down signal BLPD transits to 'low', and new data D and /D to be written through the data bus 70 are inputted.

Here, when the data stored in the capacitor CAP is 'low', the PNPN diode switch 12 is kept off, so that the voltage level of the bit line BL is not changed. On the other hand, the PNPN diode switch 12 is turned on only when the data stored in the capacitor CAP is 'high', so that the voltage level of the bit line BL rises to a high sensing voltage level.

In a period t2, the sense amplifier enable signal SEN is activated to amplify data in the bit line BL.

Thereafter, in a period t3, the voltage of the word line WL transits to the negative voltage. That is, a difference between the low voltage level of the bit line BL and the negative voltage level of the word line WL does not reach the state of the threshold voltage Vc to turn on the PNPN diode switch 11 of the PNPN nano tube switch 10.

However, a voltage over the threshold voltage Vc to turn on the PNPN diode switch 11 is applied depending on the difference between the high amplification voltage of the bit line BL and the negative voltage of the word line WL. As a result, the PNPN diode switch 11 is turned on, so that data "1" is written in the nano tube cell.

After the PNPN diode switch 11 is turned on, as shown in FIG. 7, a large amount of current can flow although a small voltage V0 is applied to the bit line BL. As a result, in the period t3, although the voltage of the word line WL rises from the negative voltage to the low level, current can flow sufficiently.

In the period t3, if the column selecting signal CS transits to 'high', the NMOS transistors N6 and N7 of the column selection switching unit 62 are turned on, so that the data D and /D inputted through the data bus 70 are applied to the bit line BL.

As described above, a nano tube cell and a memory device using the same according to an embodiment of the present invention has the following effects: to provide a PNPN nano tube switch through a simple process using a SOI wafer in a DRAM; to provide a cross point cell using a capacitor and a PNPN nano tube switch which does not require an additional gate control signal, thereby reducing the whole size of the memory; and to effectively drive read/write operations in the above-described cell array using a capacitor and a PNPN nano tube switch, thereby improving operation characteristics of memory cells.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A nano tube cell comprising:
    a capacitor whose one terminal is connected to a word line; and
    a PNPN nano tube switch, which includes a first PNPN diode switch connected forward between a bit line and a bottom electrode of the capacitor, and a second PNPN diode switch connected backward between the bit line and the bottom electrode of the capacitor successively connected in series and divided into two groups each connected in parallel between the bit line and the other terminal of the capacitor, for being selectively switched depending on a voltage applied to the word line and the bit line,
    wherein the PNPN nano tube switch is switched to read data stored in the capacitor when a first voltage is applied to the word line, and to write data in the capacitor when a second voltage larger than the first voltage is applied to the bit line,
    wherein the first PNPN diode switch has an upper P-type region connected to the bottom electrode and a lower N-type region connected to the bit line.

2. The nano tube cell according to claim 1, wherein the second PNPN diode switch has a lower N-type region connected to the bottom electrode and an upper P-type region connected to the bit line.

3. The nano tube cell according to claim 1, wherein when a voltage level of the word line is 'high' and a voltage level of the bit line is 'low' to turn on the first PNPN diode switch, the PNPN nano tube switch outputs high data stored in the capacitor to the bit line, and
    when the voltage level of the word line is a negative trigger voltage and the voltage level of the bit line is 'high' to turn on the second PNPN diode switch, the PNPN nano switch outputs data applied from the bit line to the capacitor.

4. The nano tube cell according to claim 1 wherein the PNPN nano tube switch, which has a nano meter scale in width and in length, comprises at least two or more of the PNPN diode switches which are connected serially with tube type.

5. A nano tube cell comprising:
    a PNPN nano tube switch including an insulating layer formed on a substrate and at least two or more PNPN diode switches which are made of silicon layers on the insulating layer and successively connected in series;
    a capacitor, which comprises a top electrode, an insulating film and a bottom electrode, for reading and writing data depending on the amount of current applied from a word line or a bit line;
    a bit line connected to both nodes of the PNPN nano tube switches through a bit line contact node;
    a contact node for connecting the bottom electrode to a common node where at least two or more PNPN diode switches are connected; and
    a word line formed on the top electrode.

6. The nano tube cell according to claim 5, wherein the silicon layer is formed of growth silicon.

7. The nano tube cell according to claim 5, wherein the silicon layer is formed of poly silicon.

8. The nano tube cell according to claim 5, wherein the silicon layer forms a diode chain including at least two or more PNPN diode switches that are successively connected in series.

9. A memory device using a nano tube cell, comprising:
a plurality of nano tube cell arrays each including a plurality of unit nano tube cells arranged in row and column directions;
a plurality of word line driving units for selectively driving word lines of the plurality of nano tube cell arrays; and
a plurality of sense amplifiers for sensing and amplifying data applied from the plurality of nano tube cell arrays,
wherein each of the plurality of unit nano tube cells comprises:
a capacitor whose one terminal is connected to a word line; and
a PNPN nano tube switch, which includes at least two or more PNPN diode devices successively connected in series and divided into two groups each connected in parallel between a bit line and the other terminal of the capacitor, for being selectively switched depending on a voltage applied to the word line and the bit line.

10. The memory device according to claim 9, further comprising:
a data bus shared by the plurality of sense amplifiers;
a main amplifier for amplifying data applied from the data bus;
a data buffer for buffering amplification data applied from the main amplifier; and,
an input/output port for externally outputting output data applied from the data buffer or applying externally applied input data to the data buffer.

11. The memory device according to claim 9, wherein each of the plurality of nano tube cell arrays comprises:
a plurality of unit nano tube cells located where a plurality of word lines arranged in a row direction and a plurality of bit lines arranged in a column direction are crossed; and
a plurality of unit nano tube cells located where a plurality of word lines arranged in a row direction and a plurality of bit lines arranged in a column direction are crossed; and
a plurality of bit line pull-down devices connected one by one to the plurality of bit lines.

12. The memory device according to claim 9, wherein the plurality of sense amplifiers connected one by one to the plurality of bit lines compare and amplify a reference voltage with voltage of the bit lines.

13. The memory device according to claim 9, wherein each of the plurality of nano tube cell arrays comprises:
a plurality of unit nano tube cells located where a plurality of word lines arranged in the row direction are crossed with a plurality of paired bit lines each consisting of a bit line and a bit line bar arranged in the column direction; and
a plurality of bit line pull-down devices connected one by one to the plurality of bit lines and bit line bars.

14. The memory cell device according to claim 9, wherein each of the plurality of sense amplifiers which is connected to a pair of bit lines amplifies a voltage applied from the pair of bit lines when a sense amplifier enable signal is activated.

15. The memory device according to claim 9, wherein the PNPN nano tube switch comprises:
a first PNPN diode switch connected forward between the bit line and a bottom electrode of the capacitor; and
a second PNPN diode switch connected backward between the bit line and the bottom electrode of the capacitor.

16. The memory device according to claim 15, wherein the first PNPN diode switch has an upper P-type region connected to the bottom electrode and a lower N-type region connected to the bit line.

17. The memory device according to claim 15, wherein the second PNPN diode switch has a lower N-type region connected to the bottom electrode and an upper P-type region connected to the bit line.

18. The memory device according to claim 9, wherein the PNPN nano tube switch, which has a nano meter scale in width and in length, comprises at least two or more of the PNPN diode switches which are connected serially with a tube type.

* * * * *